United States Patent
Lee

(10) Patent No.: US 8,368,164 B2
(45) Date of Patent: Feb. 5, 2013

(54) PHOTOTRANSISTOR HAVING A BURIED COLLECTOR

(75) Inventor: Byoung-Su Lee, Yeosu-si (KR)

(73) Assignee: Siliconfile Technologies Inc., Seoul (KR)

( * ) Notice: Subject to any disclaimer, the term of this patent is extended or adjusted under 35 U.S.C. 154(b) by 625 days.

(21) Appl. No.: 12/599,309

(22) PCT Filed: May 7, 2008

(86) PCT No.: PCT/KR2008/002548
§ 371 (c)(1),
(2), (4) Date: Nov. 9, 2009

(87) PCT Pub. No.: WO2008/143413
PCT Pub. Date: Nov. 27, 2008

(65) Prior Publication Data
US 2010/0237455 A1    Sep. 23, 2010

(30) Foreign Application Priority Data

May 22, 2007    (KR) .................. 10-2007-0049701

(51) Int. Cl.
*H01L 31/10*    (2006.01)
(52) U.S. Cl. ................ 257/462; 257/E31.053
(58) Field of Classification Search .......... 257/462, 257/544, 577, 378, E31.053
See application file for complete search history.

(56) References Cited

U.S. PATENT DOCUMENTS

| 3,838,439 A * | 9/1974 | Biard ..................... 257/462 |
| 2002/0070417 A1 | 6/2002 | Kimura et al. |
| 2002/0123178 A1 | 9/2002 | Ejiri et al. |
| 2007/0103748 A1 | 5/2007 | Hashimoto et al. |

OTHER PUBLICATIONS

PCT International Search Report of International Application No. PCT/KR2008/002548, Sep. 2008.

* cited by examiner

*Primary Examiner* — Mark Prenty
(74) *Attorney, Agent, or Firm* — Kile Park Goekjian Reed & McManus PLLC

(57) ABSTRACT

A phototransistor used for an image sensor is provided. The phototransistor can reduce a dark current that occurs in the phototransistor and improve sensitivity at low luminance without crosstalk with a neighboring pixel or an image lag by including a buried collector. In the phototransistor including the buried collector, since the collector is not directly connected to outside, the phototransistor has a low dark current and a high photosensitive characteristic at low luminance. Since each image sensor is isolated, crosstalk between pixels or an image lag does not occur.

6 Claims, 5 Drawing Sheets

(b)

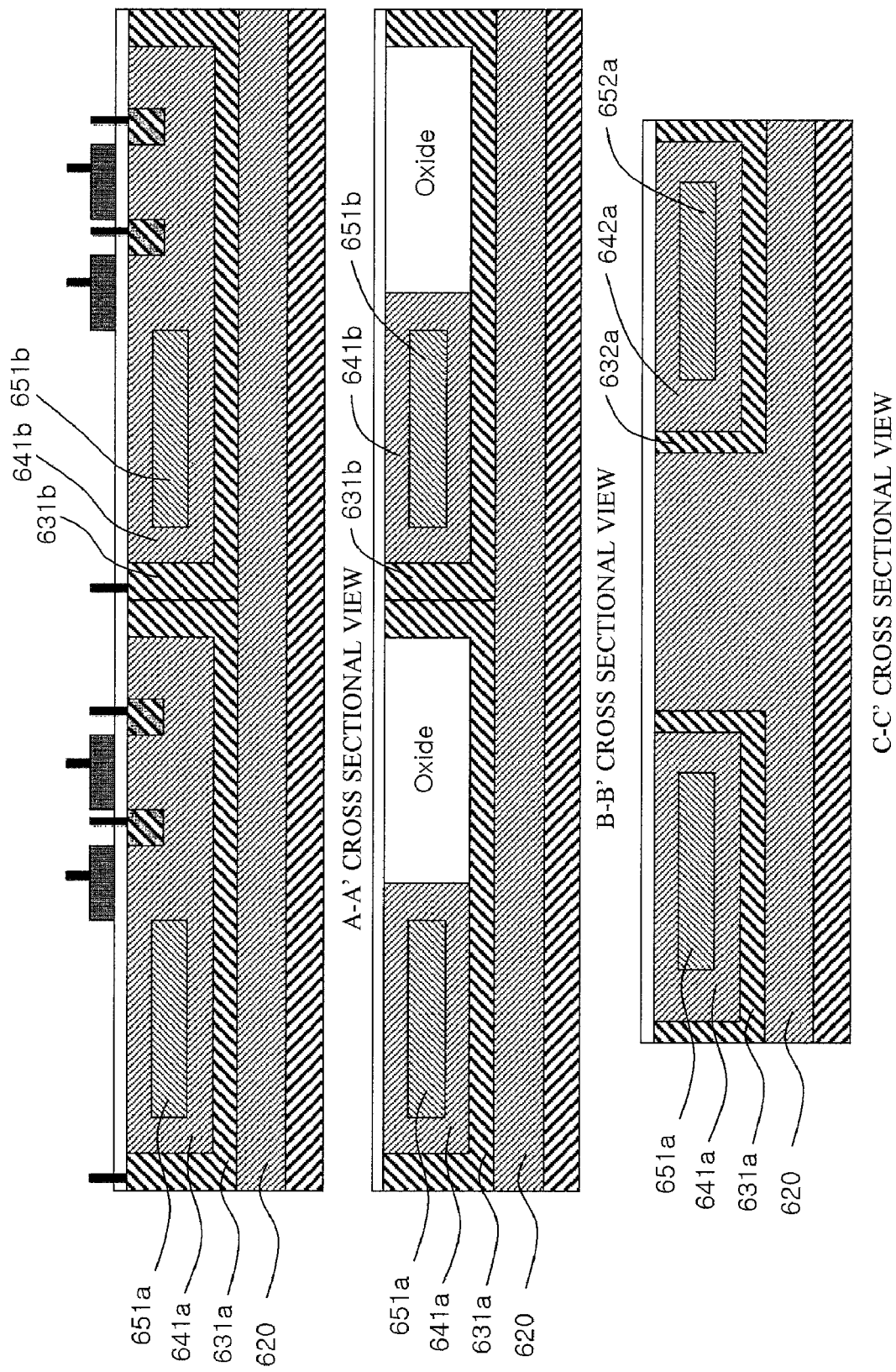

PHOTOTRANSISTOR HAVING A BURIED COLLECTOR

BACKGROUND OF THE INVENTION

1. Field of the Invention

The present invention relates to a phototransistor used for an image sensor, and more particularly, to a phototransistor capable of reducing a dark current that occurs in the phototransistor and improving sensitivity at low luminance without crosstalk with a neighboring pixel or an image lag by including a buried collector.

2. Description of the Related Art

An image sensor is used to measure strength of light. An image sensor with high sensitivity is constructed with a plurality of phototransistors. In general, the image sensor with high sensitivity uses phototransistors having a laminated or integrated structure.

A phototransistor generates an output current proportional to strength of incident light. Photons which are absorbed in a junction region between a collector and a base or a junction region between an emitter and a base of the phototransistor generate electron-hole pairs collected by a PN junction. Minority carriers collected by the junction operate as a base current. The base current is multiplexed based on a transistor gain, thereby generating a collector current. In addition, an emitter current is a sum of the base current and the collector current and generally used as an output current.

FIG. 1 illustrates a phototransistor having a laminated structure according to a conventional technique.

As shown in FIG. 1, a conventional phototransistor having a laminated structure is constructed with an n+ emitter 115, a p type base 113, and an n type collector 112. In addition, the conventional phototransistor may further include an intrinsic absorption layer 114 between the emitter 115 and the base 113. This structure may be constructed with a p+ emitter, an n type base, and a p type collector.

In the aforementioned structure, when a voltage is applied to the emitter 115 and the collector 112, a weak current flows between the base 113 and the collector 112. However, a barrier is formed between the emitter 115 and the base 113. The current is limited due to the barrier. At this time, when photons are incident onto the base 113, electron-hole pairs (EHPs) are generated due to the photons. Electrons move to the collector 112. Holes fill the barrier formed in the base 113.

Accordingly, as the number of holes increases, the potential of the barrier is lowered due to the holes collected in the barrier, thereby generating a current flow from the emitter to the collector in proportion to the decrease in potential. Thus, a current flows. The current introduced into the collector is greater than an optical current due to the electron-hole pairs generated by the incident light, at all times. The aforementioned procedure may be understood by using FIG. 2.

FIG. 2 illustrates operation mechanism of a general phototransistor.

As shown in FIG. 2, when a voltage is applied between an emitter and a collector, a barrier is formed in a region between the emitter and a base (a of FIG. 2). At this time, when light is incident onto the base, electrons move to the collector, and holes are collected in the barrier.

The potential of the barrier is lowered due to the holes collected in the barrier (b of FIG. 2). Accordingly, electrons of the emitter can easily move to the collector. That is, although the number of the collected holes is small, a large current flows.

Since the conventional phototransistor having the laminated structure is manufactured by using a deposition method or a crystal growth method, it is very limited to apply a procedure of manufacturing the conventional phototransistor to a general procedure of manufacturing a complementary metal oxide semiconductor (CMOS).

In addition, since it is difficult to deal with a dark current generated at a surface, a change between pixels is large. Accordingly, it is difficult to apply the conventional phototransistor to an element that requires a uniform pixel characteristic such as an image sensor.

FIG. 3 illustrates a phototransistor having an integrated structure according to a conventional technique.

Referring to FIG. 3, the conventional phototransistor having the integrated structure is constructed with two electrodes poly-1 and poly-2, an n+ emitter, a p type base, and an n type well or collector. In addition, a field oxide layer (FOX) for separating pixels from one another is formed.

At this time, in a state where a negative voltage is applied to the emitter and a negative voltage is applied to an electrode poly-2, when light is incident onto the p type base, electron-hole pairs are generated. Electrons among the generated electron-hole pairs move to the n type well (collector), and holes remain in the base, thereby increasing potential of the base.

When a negative voltage is applied to the electrode poly-2, holes remaining in the base are dragged into the electrode poly-2. Accordingly, holes proportional to an amount of light are collected in the electrode poly-2. In this state, since only a current caused by movement of electrons exists, a weak current flows. This state is referred to as a hole accumulation state.

A procedure of reading an image is achieved by applying a positive or zero voltage to the electrode poly-2. That is, when the positive voltage is applied to the electrode poly-2, a junction between the base and the emitter is forwardly biased. Accordingly, holes collected in the hole accumulation state are pushed out due to repulsive force. At this time, most holes exist between the emitter and the collector. Accordingly, since the barrier between the base and the emitter is lowered due to the holes, a current related to the amount of holes collected in the base flows between the emitter and the collector.

In a case where strong light is incident onto the base of the phototransistor having the aforementioned structure, the base potential is rapidly increased due to the holes generated by the light until the junction between the base and the emitter is weakly biased in the forward direction. In addition, holes that are generated in the base fill a region under the electrode poly-2 and flow to the emitter. Accordingly, a large current flows in an electrode poly-1 in the hole accumulation state. This large current is referred to as an overflow. This large current operates as noise of a neighboring pixel. In addition, since it is difficult to remove holes of a pixel exposed to strong light, an image lag in which bright light is dragged occurs, thereby deteriorating image quality.

On the other hand, the emitter is connected to the base through the surface, and the base is connected to a ground through the surface. Accordingly, a dark current may occur in low luminance.

SUMMARY OF THE INVENTION

The present invention provides a phototransistor used for an image sensor, which includes a buried collector, the phototransistor with high sensitivity in a dark state due to a small dark current without noise caused by a neighboring pixel and an image lag in a bright state.

According to an aspect of the present invention, there is provided a phototransistor including a buried collector, the phototransistor comprising: a first conductive emitter; a second conductive base; and a first conductive collector buried in the base.

In the above aspect of the present invention, the phototransistor may be separated from a neighboring phototransistor through the emitter.

In addition, the collector may be electrically connected through a metal oxide semiconductor (MOS).

In addition, the emitter may be doped with a high concentration.

In addition, the base may be doped with a low concentration.

In addition, the collector may be doped with a low concentration.

BRIEF DESCRIPTION OF THE DRAWINGS

FIG. 7 is a cross sectional view illustrating the array of the phototransistors including the buried collector according to the embodiment of FIG. 6.

DETAILED DESCRIPTION OF THE INVENTION

Hereinafter, the present invention will be described in detail by explaining exemplary embodiments of the invention with reference to the attached drawings.

Figure 1:
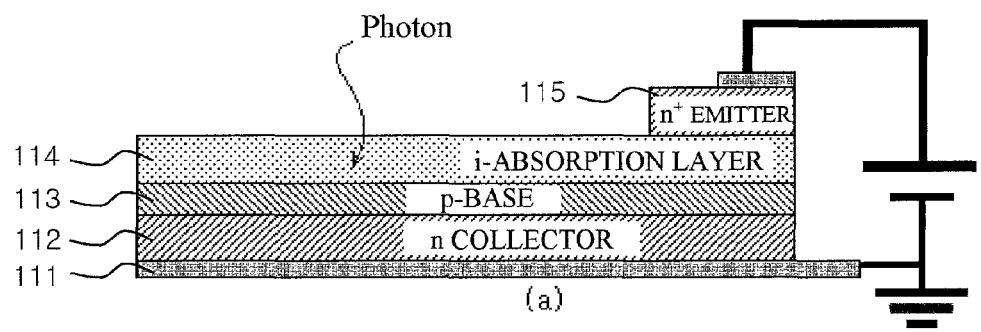
FIG. 1 illustrates a phototransistor having a laminated structure according to a conventional technique.
Figure 2:
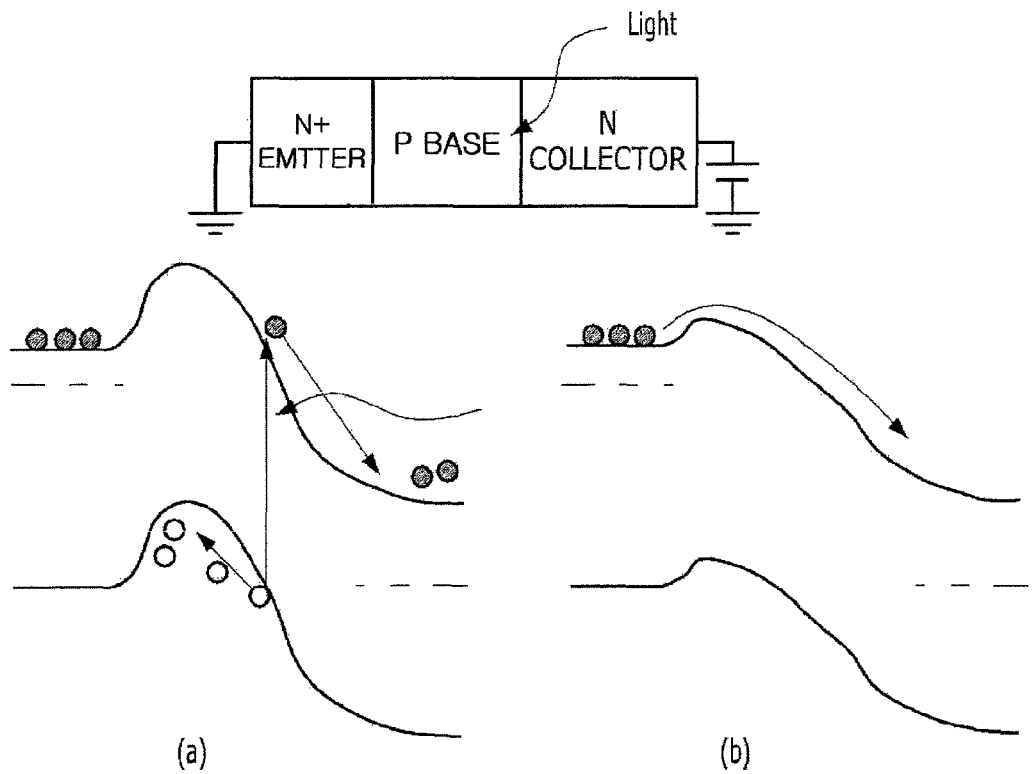
FIG. 2 illustrates operation mechanism of a general phototransistor.
Figure 3:
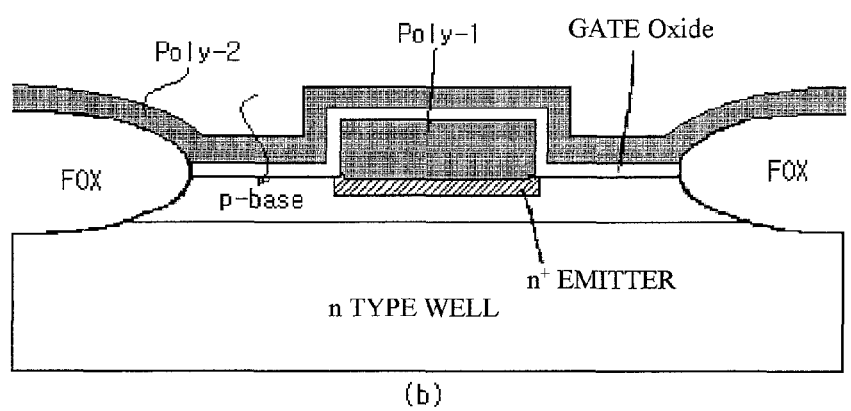
FIG. 3 illustrates a phototransistor having an integrated structure according to a conventional technique.
Figure 4:
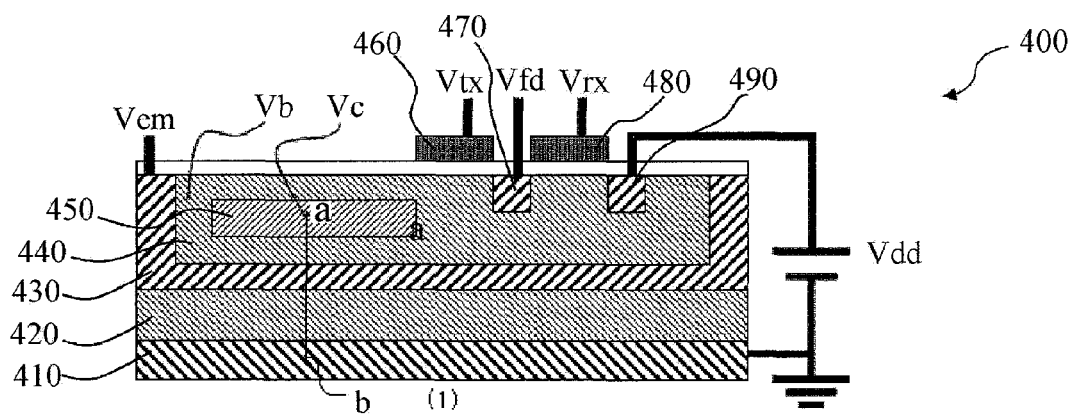
FIG. 4 illustrates a structure of a phototransistor including a buried collector according to an embodiment of the present invention.
Figure 5:
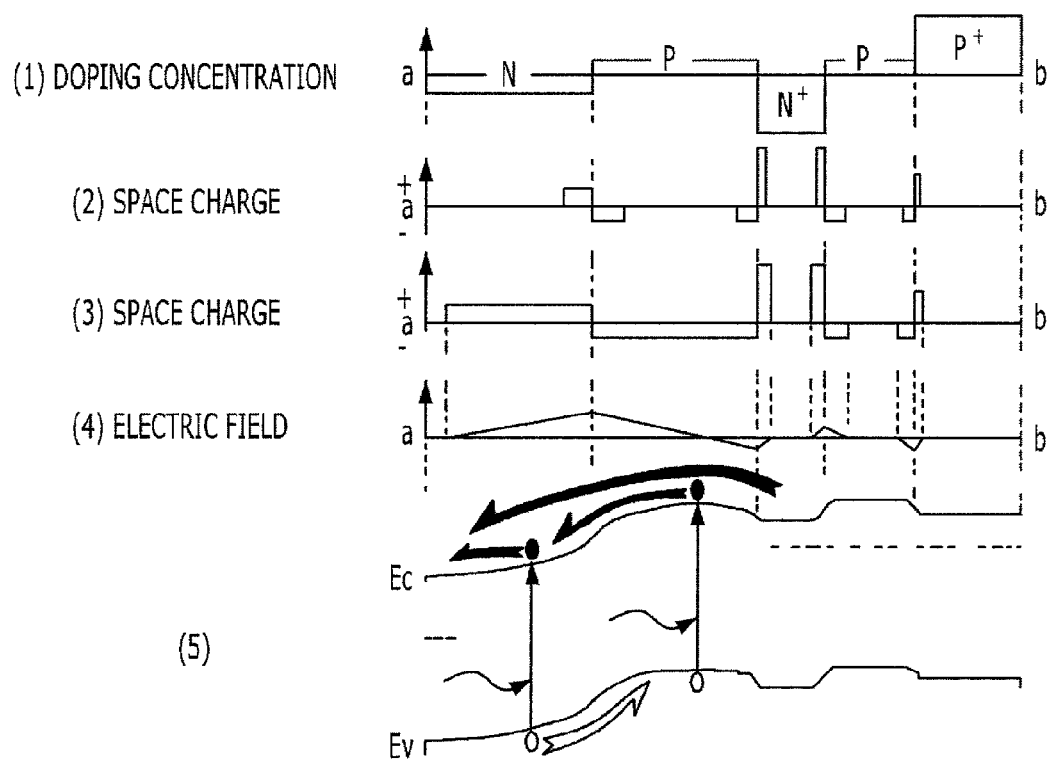
FIG. 5 illustrates electronic potential of the phototransistor including the buried collector according to the embodiment of the present invention.

FIG. 4 illustrates a structure of a phototransistor including a buried collector according to an embodiment of the present invention. FIG. 5 illustrates electronic potential of the phototransistor including the buried collector according to the embodiment of the present invention.

Referring to FIG. 4, the phototransistor including the buried collector according to the embodiment includes a P type layer 420, an N+ type emitter 430, a P type base 440, and an N type collector 450 which are sequentially formed on a P+ type substrate 410.

The N+ type emitter 430 encloses the base 440 and the collector 450. The N+ type emitter 430 is separated from a neighboring phototransistor. In addition, the N type collector 450 is completely buried into the p type base 440.

The collector 450 is electrically connected through a transfer transistor gate 460 of transfer transistor. A floating diffusion region 470 is connected to a constant voltage Vdd through a gate 480 of a reset transistor. The emitter 430 is connected to an emitter voltage Vem.

An example of doping concentration on a line that connects a point a of the collector 450 shown in FIG. 4 to a point b of the P+ substrate 410 is shown in (1) of FIG. 5. That is, the collector 450 is doped with N type dopants in low concentration on the substrate 410 that is doped with P+ type dopants in high concentration. The base is doped with P type dopants in low concentration. The emitter 430 is doped with N+ type dopants in high concentration.

In the aforementioned doped state, in a case where an external voltage is not applied, a depletion region or a space charge region is formed in a PN junction region. Accordingly, distribution of the space charge is shown in (2) of FIG. 5.

Here, in a case where a voltage Vtx of the gate 460 of the transfer transistor, a voltage Vrx of the gate 480 of the reset transistor, and the constant voltage Vdd are positive, and a zero voltage is applied to the voltage Vem of the emitter, the depletion region is extended. The distribution of the space charge is shown in (3) of FIG. 5.

An electric field due to the distribution of the space charge is shown in (4) of FIG. 5. A conduction band and a valence band due to the distribution of the space charge are shown in (5) of FIG. 5.

In the aforementioned energy band, when the voltage Vtx of the gate 460 of the transfer transistor is fixed to 0, the collector 450 is isolated. No current flows due to the barrier between the base 440 and the emitter 430.

In this state, in a case where light is incident onto regions of the emitter 430 and the collector 450, electron-hole pairs are generated. Like a general phototransistor, electrons move to the collector 450, and holes fill the barrier formed in the base 440. The holes collected in the base 440 lowers potential of the barrier between the base 440 and the emitter 430. Accordingly, in a case where a large amount of holes are collected, a large amount of electrons are introduced from the emitter 430 to the collector 450. Accordingly, since electrons (photoelectrons) generated due to photons and electrons that move from the emitter 430 to the collector 450 are collected in the collector 450, a larger amount of electrons than that of electrons generated due to incident light exist in the collector 450.

When the transfer transistor is turned on, the collected electrons move to the floating diffusion region 470. The electrons are converted into a voltage through the same procedure as the photodiode.

Since the phototransistor having the aforementioned structure is completely buried into the base, noise occurring at a surface is not introduced into the collector, thereby reducing noise. In addition, since the phototransistor is separated from a neighboring pixel by the emitter, it is possible to reduce crosstalk occurring between neighboring pixels. In addition, in a case where the phototransistor is exposed to strong light, the voltage of the isolated collector rapidly becomes 0. Accordingly, since no more current flow, an overflow does not occur.

Figure 6:
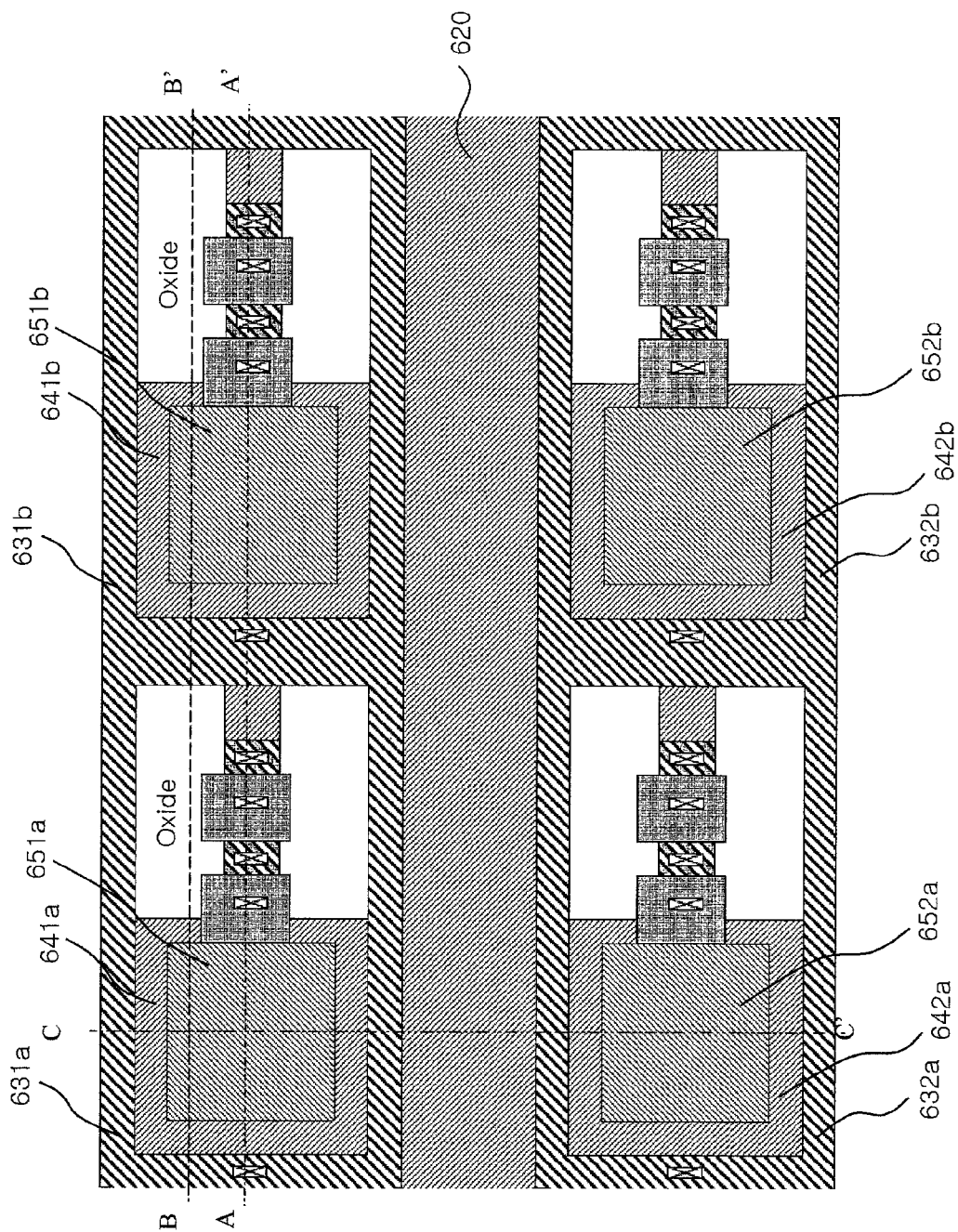
FIG. 6 is a top plan view illustrating an array of phototransistors including a buried collector according to an embodiment of the present invention.

FIG. 6 is a top plan view illustrating an array of phototransistors including a buried collector according to an embodiment of the present invention. FIG. 7 is a cross sectional view illustrating the array of the phototransistors including the buried collector according to the embodiment of FIG. 6.

As shown in FIG. 6, emitters 631a and 631b of photodiodes located in the same row are electrically connected to each other and emitters 631a and 632a of photodiodes located in different row are separated from each other through a row separation region 620.

Referring to FIG. 7, in the same layout as that of FIG. 6, cross sectional structures taken along the lines A-A', B-B', and C-C' are known. Here, a shallow trench isolation (STI) region may be used as a row separation region.

An emitter completely includes a base and a collector of a unit pixel. The emitter is separated from a neighboring pixel. Accordingly, no crosstalk occurs due to movement of electrons between neighboring pixels.

Up to now, a phototransistor including an N+ type emitter, a P-type base, an N type buried collector, which are formed on a P type substrate, has been described. However, a phototransistor including a P+ type emitter, an N type base, and a P type buried collector on an N type substrate may be also available.

In the phototransistor including the buried collector according to an embodiment of the present invention, since the buried collector is electrically connected to outside through a metal oxide semiconductor (MOS), less noise occur. In addition, since a pixel is separated from a neighboring pixel through an emitter region, crosstalk caused by movement of electrons from the neighboring pixel, which may generally occur in a general image sensor, does not occur.

In addition, in a case where the phototransistor is exposed to strong light, when holes are introduced into the emitter, since the collector is isolated, the voltage of the collector is substantially zero. No more current flows. Thus, noise does not occur in the phototransistor. Since holes accumulated due to the strong light is removed by making the voltage of the emitter negative, an image lag in which an image of the strong light is dragged does not occur.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A phototransistor including a buried collector, the phototransistor comprising:
   a first conductivity type emitter;
   a second conductivity type base; and
   a first conductivity type collector buried in the base.

2. The phototransistor of claim 1, which is separated from a neighboring phototransistor through the emitter.

3. The phototransistor of claim 1, wherein the collector is electrically connected through a metal oxide semiconductor (MOS).

4. The phototransistor of claim 1, wherein the emitter is doped with a high concentration.

5. The phototransistor of claim 1, wherein the base is doped with a low concentration.

6. The phototransistor of claim 1, wherein the collector is doped with a low concentration.

* * * * *